United States Patent
Ogata et al.

(10) Patent No.: US 9,562,126 B2
(45) Date of Patent: Feb. 7, 2017

(54) PROCESS FOR PRODUCING FLUORINE CONTAINING POLYMER

(75) Inventors: Naoya Ogata, Otsu (JP); Fumito Yamai, Otsu (JP); Tsutomu Sada, Otsu (JP)

(73) Assignee: PIOTREK CO., LTD., Shiga (JP)

( * ) Notice: Subject to any disclaimer, the term of this patent is extended or adjusted under 35 U.S.C. 154(b) by 1527 days.

(21) Appl. No.: 13/260,928

(22) PCT Filed: Mar. 30, 2010

(86) PCT No.: PCT/JP2010/055752
§ 371 (c)(1),
(2), (4) Date: Jan. 11, 2012

(87) PCT Pub. No.: WO2010/113971
PCT Pub. Date: Oct. 7, 2010

(65) Prior Publication Data
US 2012/0107726 A1    May 3, 2012

(30) Foreign Application Priority Data

Mar. 30, 2009  (JP) ................................. 2009-083676

(51) Int. Cl.
| | | |
|---|---|---|
| *H01G 9/025* | (2006.01) | |
| *H01G 9/035* | (2006.01) | |
| *H01L 51/46* | (2006.01) | |
| *H01M 10/0562* | (2010.01) | |
| *H01M 8/10* | (2016.01) | |
| *C08F 259/08* | (2006.01) | |
| *H01B 1/12* | (2006.01) | |
| *H01G 9/028* | (2006.01) | |
| *H01G 9/022* | (2006.01) | |
| *H01G 11/56* | (2013.01) | |
| *H01G 11/62* | (2013.01) | |
| *H01M 10/0525* | (2010.01) | |
| *H01M 10/0565* | (2010.01) | |
| *H01L 51/50* | (2006.01) | |

(52) U.S. Cl.
CPC ............ *C08F 259/08* (2013.01); *H01B 1/122* (2013.01); *H01G 9/028* (2013.01); *H01G 9/038* (2013.01); *H01G 11/56* (2013.01); *H01G 11/62* (2013.01); *H01M 8/1023* (2013.01); *H01M 8/1039* (2013.01); *H01M 8/1053* (2013.01); *H01M 8/1088* (2013.01); *H01M 10/0525* (2013.01); *H01M 10/0565* (2013.01); *H01L 51/5032* (2013.01); *Y02E 10/542* (2013.01); *Y02E 60/122* (2013.01); *Y02E 60/13* (2013.01); *Y02E 60/521* (2013.01); *Y02P 70/521* (2015.11); *Y02P 70/54* (2015.11); *Y02P 70/56* (2015.11)

(58) Field of Classification Search
CPC ...... C08F 259/00; C08F 259/02; C08F 259/08; H01B 1/122; H01L 51/5032; H01G 11/56; H01G 9/028; H01G 9/038; H01M 10/0565; H01M 8/1023; H01M 8/1039; H01M 8/1053; H01M 8/1088; Y02E 60/122; Y02E 60/13; Y02E 60/521; Y02P 70/521; Y02P 70/54; Y02P 70/56

See application file for complete search history.

(56) References Cited

U.S. PATENT DOCUMENTS

| | | | | |
|---|---|---|---|---|
| 3,624,053 A | * | 11/1971 | Gibbs | ...................... B01J 39/20 |
| | | | | 521/33 |
| 2006/0057465 A1 | | 3/2006 | Ogata et al. | |
| 2007/0202377 A1 | | 8/2007 | Hommura et al. | |

FOREIGN PATENT DOCUMENTS

| | | |
|---|---|---|
| JP | 50-32289 A | 3/1975 |
| JP | 2007-157428 A | 6/2007 |
| WO | WO 2004/088671 A1 | 10/2004 |
| WO | WO 2006/046620 A1 | 5/2006 |

OTHER PUBLICATIONS

Kim, Y. W. et al. Journal of Membrane Science vol. 313 pp. 315-322 (2008).*
Zhang, M. et al. Macromolecules vol. 39 pp. 3531-3539 (2006).*
International Search Report of PCT/JP2010/055752 (May 25, 2010).

* cited by examiner

*Primary Examiner* — Irina S Zemel
*Assistant Examiner* — Jeffrey Lenihan
(74) *Attorney, Agent, or Firm* — Millen, White, Zelano & Branigan, P.C.

(57) ABSTRACT

According to this invention, a process for producing fluorine containing polymer to obtain composite polymer electrolyte composition having excellent ion transport number, that is, ion transfer coefficient, for example, excellent transport number of lithium ion, is provided.
A process for producing fluorine containing polymer comprising graft-polymerizing a molten salt monomer having a polymerizable functional group and a quaternary ammonium salt structure having a quaternary ammonium cation and anion, with a polymer having the following unit;

—$(CR^1R^2—CFX)$—

X means halogen atom except fluorine atom,
$R^1$ and $R^2$ mean hydrogen or fluorine atom, each is same or different atom.

6 Claims, 3 Drawing Sheets

PROCESS FOR PRODUCING FLUORINE CONTAINING POLYMER

FIELD OF THE INVENTION

This invention relates to a process for producing fluorine containing polymer to be disposed between a pair of electrodes of electrochemical devices such as lithium ion batteries, lithium ion capacitor, polymer electrolyte membrane (PEM) type fuel cells, dye-sensitized solar cells, electrolytic capacitors or organic electroluminescence cells and its same group devices.

BACKGROUND ART

Non-aqueous electrolyte solutions containing a lithium salt are generally used in lithium ion batteries, lithium ion capacitor and electrolytic capacitors. The non-aqueous electrolyte solution comprises an aprotic polar solvent and a lithium salt dissolved therein, as carbonate group such as ethylene carbonate, propylene carbonate, dimethyl carbonate, diethyl carbonate or methyl ethyl carbonate, butyl carbonate, or lactones such as γ-butyrolactone, or ethers such as tetrahydrofuran, and formulated two kinds of them or more. These organic solvents, however, are generally volatile and inflammable, and their use lead out safety issues whenever the battery is overly charged, discharged or short-circuited. Also liquid electrolyte solutions encounter handling difficulties when sealing the battery cells in saturating electrolyte density. The electrolyte solution may be solidified into a gel but problems of volatilization and inflammability of the organic solvent as well as leakage of liquid electrolyte made a phase separation from gel still remain unsolved.

Recently a lithium ion battery has been proposed which utilizes a non-aqueous electrolyte comprising an ambient molten quaternary ammonium salt and a lithium salt dissolved therein. See, JP-A-10/92467, JP-A-10/265674, JAP-A-11/92467, JP-A-2002/042870. The molten salt is liquid at ambient temperature but safe by properties of its non-volatility and non-inflammability. Even the molten salt electrolyte provide solidified with a matrix polymer into a gel, the resulting gel possesses poor mechanical properties and often suffers from phase separation into liquid. Thus problems remain unsolved with respect to handling of electrolyte and battery design utilizing such as molten salt electrolyte. JP-A-10/83821 and JP-A-2000/11753 propose a total solid polymer electrolyte prepared by polymerizing an ion conductive molten salt monomer having a vinyl group introduced into an imidazolium salt. This polymer electrolyte does not possess a sufficient mechanical strength and also sufficient ion transfer coefficient, that is, practically effective ionic transport number.

PCT-WO2004/88671 propose a composite polymer electrolyte composition prepared by polymerizing like grafting the electrochemically inert polymeric reinforcing material such as polyvinylidene fluoride with the molten salt polymer having a quaternary ammonium salt structure comprising quaternary ammonium cation group and anion group containing halogen atom, and also having introduced therein a plurality of crosslinkable functional groups such as carbon-to-carbon double bonds.

These grafting polymer of composite electrolyte polymer composition are slightly improved an ion conductivity and excellent non-inflammability, however, its ion transfer coefficient, that is, ionic transport number is still insufficient to meet an implementation performance level. These facts make clear in data of comparison tests described later.

SUMMARY OF THE INVENTION

This invention proposes a process for producing a fluorine containing polymer having remarkably improved the ion transfer coefficient, that is, ionic transport number.

This purpose is to attribute a process for producing fluorine containing polymer consisting of graft-polymerizing a molten salt monomer having a polymerizable functional group and a quaternary ammonium salt structure having a quaternary ammonium cation and anion, with a polymer having the following unit;

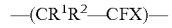
—(CR$^1$R$^2$—CFX)—

X means halogen atom except fluorine atom,
R$^1$ and R$^2$ means hydrogen atom or fluorine atom, each is same or different atom.

This purpose is to attribute better by producing composite polymer electrolyte composition formulating fluorine containing polymer in grafting polymerization of the molten salt monomer with the polymer, as described above. The monomer compositions are related within lithium salt as an electron transfer ion source and its same group, or materials of forming SEI, that is, Solid Electrolyte Interphase membrane vinylene carbonate group, vinylene acetate group, 2-cyanofurane, 2-thiophene carbonitrile, acrylonitrile and these same materials or solvents group.

This purpose is to attribute preferably by grafting the molten salt monomer with the polymer having —(CR$^1$R$^2$—CFX)— in 3 to 40 mol %.

PREFERRED EMBODIMENT OF THE INVENTION

Figure 1:
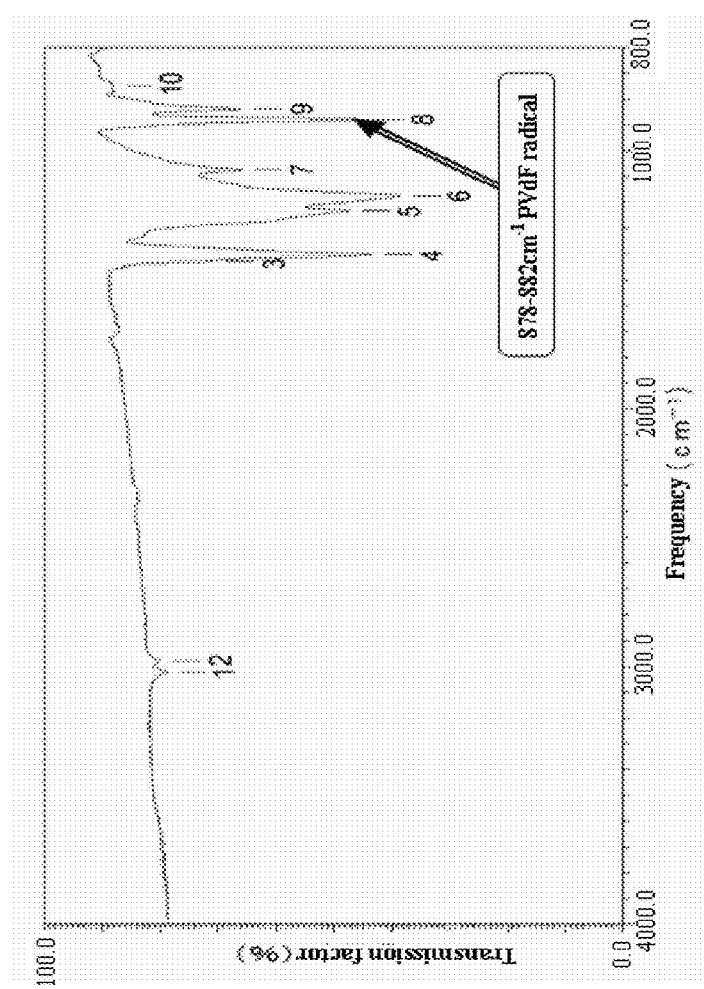
FIG. 1 IR chart of Polyvinylidene fluoride co-polymer (#7500, Kurare Co., Ltd.)

This invention is extremely important to utilize the polymer having the unit specifying

—(CR$^1$R$^2$—CFX)—       Formula:

In formula, X is of halogen atom except fluorine atom.
R$^1$ and R$^2$ are hydrogen atom or fluorine atom, each is same or different atom, and it is to enhance remarkably an ion transfer coefficient although the reason is not yet clarified, by utilizing a composite electrolyte polymer composition containing fluorine containing polymer in grafting the said polymer with the molten salt monomer. These halogen atoms are Chlorine atom as the best, bromine atom or iodine atom also.

This co-polymer having the unit of —(CR$^1$R$^2$—CFX)— specifying

—(CR$^3$R$^4$—CF$^5$X)$_m$—(CR$^1$R$^2$—CFX)$_n$—       Formula:

In formula, X is of halogen atom except fluorine atom.

$R^1$, $R^2$, $R^3$, $R^4$ and R5 are hydrogen atom or fluorine atom, each is same or different atom "m" is 65 to 99 mol %, "n" is 1 to 35 mol %.
is preferred and the best co-polymer is

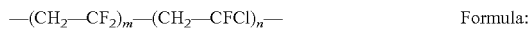  Formula:

In formula, "m" is 99 to 65 mol %, "n" is 35 to 1 mol %.

In case that "m" plus "n" is of 100 mol %, it is preferred to formulate "m" in 65 to 99 mol % and "n" in 1 to 35 mol %. The better formula is "m" in 80 to 97 mol % and "n" in 3 to 20 mol %. The best formula is "m" in 92 to 97 mol % and "n" in 3 to 8 mol %.

The said co-polymer is of block polymer or random co-polymer. And other monomers obtaining co-polymer are also utilized in a range of conforming to the purpose of this invention.

The molecular weigh of the said polymer is 100,000 to 2,000,000 mol. better as a mean molecular by weight. And the more preferred molecular by weight is 300,000 to 1,500,000. The mean molecular by weight is calculated based on the intrinsic viscosity in an estimated formula.

In case of proceeding a grafting polymerization of molten salt monomer with the said co-polymer, it is adaptable an atom transfer radical polymerization with transition metal complexes. This transition metal positioning on the complex become a trigger by pulling out halogen atom such as chlorine atom except fluorine atom, and the molten salt monomer on the said polymer is graft-polymerized with the said co-polymer.

In the atom transfer radical polymerization utilized in this invention, the co-polymer of polyvinylidene fluoride monomer composition and vinyl monomer containing fluoride and halogen atoms such as chlorine except fluorine is utilized better. The grafting polymerization of molten salt monomer is started by occurring easily pulling out halogen atom such as chlorine atom except fluorine atom faster than fluorine atom by a transition metal which is to weaken a connecting energy between carbon and halogen with presence of fluorine and halogen atoms such as chlorine except fluorine in a part of trunk polymer.

Catalysts in the atom transfer radical polymerization are utilized a transition metal halogen materials as proposed particularly Copper Chloride(I) (CuCl), acetylacetonate copper(II) and Copper Bromide (CuBr) and its same group. Ligand being formed the complex introduces 4,4'-dimethyl-2,2'-bipyridyl (bpy), tris(dimethylaminoethyl)amine (Me$_6$-TREN), N,N,N',N''-pentamethyldiethylenetriamine (PM-DETA) and its same group. In this material list, it is more better utilized the transfer metal halogen complex formulating Copper Chloride(I) (CuCl) and 4,4'-dimethyl-2,2'-bipyridyl (bpy).

The reaction solvent in this invention are utilized to be dissolving the polymer having —(CR$^1$R$^2$—CFX)— unit and as an example N-methyl pyrrolidone, dimethylacetamide, dimethylsulfoxide and its same group which are dissolved the co-polymer between polyvinylidene fluoride monomer composition, and vinyl monomer containing fluoride atom and halogen atom such as chlorine atom except fluorine. This reaction temperature are dependent on kinds of Ligand complex used, ordinarily in the range of 10 to 110 degree C.

One of Other polymerization methods is utilized also ultraviolet ray with a photo polymerization trigger and is to be irradiated a radiation ray such as electron beam and its same group. This electron beam polymerization method is being to obtain a crosslinking reaction on co-polymer itself and to being possibly a grafting reaction on a reinforcing material of the monomer, which are specified well. The irradiation volume is controlled preferring in 0.1 to 50 Mrad and 1 to 20 Mrad as more preferred.

This invention it to make grafting polymerization at range between 3 and 40 mol %, in conditioning the recipe of polymer structure at 97 to 60 mol % as monomer unit and 3 to 40 mol % of the molten salt monomer to meet plastic physical properties aimed as the controlling target. In case of making grafting polymerization of the molten salt monomer on the said polymer, the polymer are of liquid, solid including gel form, composite materials such as film, porous film and its same group, either.

This invent introduce quaternary ammonium salt structure consisting of quaternary ammonium cation and anion such as anion containing halogen atoms and salt structure of the molten salt monomer having polymerized radicals, of which salt structures are related quaternary ammonium cation having an aliphatic, an alicyclic, an aromatic or a heterocyclic radicals and anion such as halogen containing anion and fluorine containing anion as preferred. This quaternary ammonium cation is specified onium cation containing nitrogen and included heterocyclic onium ion such as imidazolium or pyridium. It is preferred the salt structure consisting of ammonium cation at least one kind selected from ammonium cation group as described below and anion at lease one kind selected from anion group as described below.

Ammonium Cation Group:

Pyrrolium cation, pyridinium cation, imidazolium cation, pyrazolium cation, benzimidazolium cation, indolium cation, carbazolium cation, quinolinium cation, pyrrolidinium cation, piperidinium cation, piperazinium cation, alkylammonium cation including substituted with hydrocarbon radicals having 1 to 30 carbon atoms, hydroxyalkyl or alkoxyalkyl radicals. These are connected hydrocarbon radicals having 1 to 30 carbon atoms (for example 1 to 10 carbon atoms), hydroxyalkyl or alkoxyalkyl radicals on N and/or cyclic radical of the ammonium cation.

Anion Group:

$BF_4^-$, $PF_6^-$, $C_nF_{2n+1}CO_2^-$ in n=1 to 4 as an integer whole number, $C_nF_{2n+1}SO_3^-$ in n=1 to 4 as an integer whole number, $(FSO_2)_2N^-$, $(CF_3SO_2)_2N^-$, $(C_2F_5SO_2)_2N^-$, $C(CF_3SO_2)_3N^-$, $CF_3SO_2$—N—$COCF_3^-$, R—$SO_2$—N—$SO_2CF_3^-$ wherein R is aliphatic group, $ArSO_2$—N—$SO_2CF_3^-$ wherein Ar is aromatic group, $CF_3COO^-$ and its same group containing halogen atom, and specified anion such as $COO^-$, $HCOO^-$ and its same group. Halogen atom in anions having halogen atom are preferred fluorine and also included chlorine, bromine, iodine atoms.

Materials described above in the ammonium cation group and anion group are utilized preferably lithium ion battery including lithium ion capacitor, electrolytic capacitor by reasons of enhancing thermal stability, Durability properties in REDOX and making wider electric potential window.

Polymeric radicals of the monomer are indicated C—C unsaturated radicals such as vinyl radical, acryl radical, methacryl radical, acrylamide radical, allyl radicals and its same group, cyclic-ether group as epoxy radical, oxetane radical and its same group, cyclic-sulfide group such as tetrahydrothiophene or isocyanate radical and its same group.

(A) Ammonium cation group having polymeric radicals preferred particularly include trialkylaminoethylmethacrylate ammonium cation, trialkylaminoethylacrylate ammonium cation, trialkylaminopropylacrylamido ammonium cation, 1-alkyl-3-vinyl imidazolium cation, 4-vinyl-1-alkylpyridinium cation, 1-(4-vinylbenzyl))-3-alkyl imidazolium cation, 1-(vinyloxyethyl)-3-alkylimidazolium cation, 1-vinyl imidazolium cation, 1-allylimidazolium cation, N-alkyl-N-allylammonium cation, 1-vinyl-3-alkylimidazolium cation, 1-glycidyl-3-alkyl-imidazolium cation, N-allyl-N-alkylpyrrolidinium cation or quaternary diallyl dialkyl ammonium cation All alkyls therein contain 1 to 10 carbon atoms.

(B) Anion group preferred particularly include bis{(trifluoromethyl)sulfonyl}imide anion, 2,2,2-trifluoro-N-{(trifluoromethyl)sulfonyl}acetimide anion, bis{(pentafluoro)sulfonyl}imide anion, bis{(fluoro)sulfonyl}imide anion, tetra fluoroborate anion, hexafluorophosphate anion, trifluoromethanesulfonylimide anion and its same group.

Anions having halogen atom therein are more preferred.

Besides, the molten salt monomer as salt of cation and anion group described above are most preferably included trialykylaminoethylmethacrylate ammonium wherein alkyl is $C_1$ to $C_{10}$ alkyl, N-alkyl-N-allylammonium bis{(trifluoromethyl)sulfonyl}imide wherein alkyl is $C_1$ to $C_{10}$ alkyl, 1-vinyl-3-alkylimidazolium bis{(trifluoro-methyl)sulfonyl}imide wherein alkyl is $C_1$ to $C_{10}$ alkyl, 4-vinyl-1-alkyl pyridinium bis{(trifluoromethyl)sulfonyl}imide wherein alkyl is $C_1$ to $C_{10}$ alkyl, 1-(4-vinylbenzil)-3-alkylimidazolium bis{(trifluoromethyl)sulfonyl}imide wherein alkyl is $C_1$ to $C_{10}$ alkyl, 1-glycidyl-3-alkyl-imidazolium bis{trifluoromethyl}sulfonyl}imide wherein alkyl is $C_1$ to $C_{10}$ alkyl, trialkylamino ethylmethacrylate ammonium, trifluoromethane sulfonylimide wherein alkyl is $C_1$ to $C_{10}$ alkyl, 1-glycidyl-3-alkyl-imidazoliium tetrafluoroborate wherein alkyl is $C_1$ to $C_{10}$ alkyl, N-vinylcarbazolium tetrafluoroborate wherein alkyl is $C_1$ to $C_{10}$ alkyl and its same group. Those molten salt monomer is utilized one kind or more than two kinds.

Grafting rate of the molten salt monomer on the co-polymer described above is preferred in the range of 3 to 40 mol %, more preferred at 3.5 to 35 mol % and most preferred at 7 to 30 mol %. The purpose of this invention is to attribute well by adjusting those range of grafting rate. A measuring method of the grafting ratio is described in Examples described later.

This grafting polymerization of the molten salt monomers is preferred either sole or co-polymerization of the molten salt monomer with other monomers making co-polymerization with the molten salt monomer.

Fluorine containing Polymer invented herein is preferably utilized for electrolyte polymer composition in lithium ion battery, lithium ion capacitor, PEM (Polymer Electrolyte Membrane) fuel cells, dye-sensitized solar cells, electrolytic capacitors or organic electroluminescence cells and its same group devices. Examples in each application are described in the following:

In applications of lithium ion battery and lithium ion capacitor, electron transfer ion source is typically utilized lithium salt wherein it is more preferred lithium salt consisting of lithium cation and anion having fluorine atom containing anion in the following:

$LiBF_4$, $LiPF_6$, $C_nF_{2n+1}CO_2Li$ wherein n=1 to 4 is an integer whole number, $C_nF_{2n+1}SO_3Li$ wherein n=1 to 4 is an integer whole number, $(FSO_2)_2NLi$, $(CF_3SO_2)_2NLi$, $(C_2F_5SO_2)_2NLi$, $(CF_3SO_2)_3NLi$, $Li(CF_3SO_2—N—COCF_3)$, $Li(R—SO_2—N—SO_2CF_3)$ wherein R is aliphatic group, $Li(ArSO_2—N—SO_2CF_3)$ wherein Ar is aromatic group and its same group.

In applications of electrolytic capacitors and condenser, the electron transfer ion source of electrolyte is utilized the salt containing nitrogen and preferably the salt consisting of alkylammonium cation such as tetraethylammonium cation or triethylmethylammonium cation and the anion containing fluorine atom.

$Et_4$-$N^+BF_4^-$, $Et_3Me$-$N^+BF_4^-$,
$Et_4$-$N^+PF_6^-$, $Et_3Me$-$N^+PF_6^-$ and these same group.
Et: Ethyl, Me: Methyl In applications of dye-sensitized solar cells, the electron transfer ion source of electrolyte is utilized the salt containing iodine and preferably a $I_3^-/I^-$ REDOX pair electrolyte containing alkylimidazolium iodine described below and others are also included as $Br^-/Br_2^-$ pair, quinone/hydroquinone pair and these same group.

Alkyl Imidazolium Group:
trialkylimidazolium iodine, 1,2-dimethyl-3-propylimidazolium iodine, hexylmethyl imidazolium iodine and these same group.

These ion source and fluorine containing polymer are positioned between a working electrode installing dye absorbing metal oxide semiconductor films and conductive opposite electrode for producing dye-sensitive solar cells.

In applications of PEM fuel cell, the electron transfer ion source as a proton is utilized a proton donor conforming to anion group of quaternary ammonium salt in the molten salt monomer described before. The proton donor are included in the following:

Proton Donor Group:
$HBF_4$, $HPF_6$, $C_nF_{2n+1}CO_2H$ wherein n=1 to 4 is an integer whole number, $C_nF_{2n+1}SO_3H$ wherein n=1 to 4 is an integer whole number,
$(FSO_2)_2NH$, $(CF_3SO_2)_2NH$, $(C_2F_5SO_2)_2NH$, $(CF_3SO_2)_3NH$, $(CF_3SO_2—NH—COCF_3)$, $(R—SO_2—NH—SO_2CF_3)$ wherein R is aliphatic or aromatic groups,
These proton donor, the molten salt monomer and fluorine containing polymer are positioned in between anode and cathode electrodes for producing PEM fuel cells.

In application of organic electroluminescence (EL) cells, electron transfer ion source of electrolyte consisting of electron transfer layer (ETL) and light emitting layer doped light emitting materials is utilized same materials in applications of lithium ion battery or dye-sensitive solar cell to enhance a charge carrier mobility of organic materials. By utilizing the basic technology of lithium ion battery and dye-sensitive solar cells, these ion source and fluorine containing polymer are positioned between the electron transfer layer and the light emitting layer for requiring to utilize a stable organic materials under reason that the materials used currently in organic electroluminescence cell application are sensitively influenced against oxygen and humidity and also the external masking technique are continuously developed but all the efforts of improvements are still insufficient on the longer life of EL in use.

Fluorine containing polymer containing no ion source described above is positioned between a pair of conductive electrodes for producing electrolytic capacitors and condenser.

Fluorine containing polymer of this invention is preferably utilized as the said polymeric electrolyte between a pair of electrodes in electrochemical devices such as lithium ion battery, lithium ion capacitor, PEM fuel cell, dye-sensitive solar cell, electrolytic capacitors and condenser, organic electroluminescence (EL) cell and these same group.

Electrolyte layer are included electrolyte film, layer coating on anode electrode, layer coating on cathode electrode, layer coating on separator and these same group.

In electrolyte layer, the fluorine containing polymer is preferred to become multi-layer structure integrated in molecule level, that is, forming lamella structures.

Electrodes utilized in each device are well known in those technical field. e.g. Lithium ion battery are typically consisted of anode electrode containing graphite carbon making absorption and desorption of lithium ion, and cathode electrode containing complex metal oxide active materials having lithium metal which make absorption and desorption of lithium ion. The typical active materials are included $LiCoO_2$, $LiNi_nCo_{1-n}O_2$, $LiFePO_4$, $LiMn_2O_4$, $LiNi_nMe_{1-n}O_2$ or $LiCO_nMe_{1-n}O_2$ wherein Me are, Co, Ni, Mn, Sn, Al, Fe and/or Sb and these same group, and selected one kind or more than two kinds.

In case of utilizing lithium metal or these alloy as anode active materials, cathode active materials are included metal oxides or sulfides such as $MnO_2$, $TiS_2$, $MoS_2$, $NbS_2$, $MoO_3$ and $V_2O_5$.

In application of lithium ion capacitor, hard carbon for capacitor, anode electrode is ordinarily utilized instead of graphite in lithium ion battery application. Electrolyte is utilized same as lithium ion battery application.

In application of PEM solar cell, porous electrode containing Pt as a typical catalyst is ordinarily utilized. In application of dye-sensitive solar cell, semiconductor electrode making adsorption of dye staffs on metal oxide semiconductor film such as $TiO_2$, ZnO and these same group formed on surface of conductive glass board depositing Pt as the working electrode is ordinarily utilized. In application of electrolytic capacitors and condenser, a pair of electrodes are utilized hard carbon same as that of ordinary liquid electrolyte type electrolytic capacitors.

Fluorine containing polymer of this invention is utilized as ion conductive polymer and non-inflammable or flame retardant electrolyte in applications of lithium ion battery, lithium ion capacitor, various condensers and capacitors, dye-sensitive solar cell, PEM fuel cell, organic electroluminescence (EL) cell.

This ion conductive polymer is also utilized as a surface coating material on nano-size particles of carbon, rare metals or metal oxide active materials in lithium ion battery application.

This ion conductive polymer is also utilized as conductive composite plastic resins having particle scale in submicron to 10 micron meter by conjugating with nano scale particles as described above. This ion conductive polymer is to make forming film or membrane in mechanical method upon injecting into plastic materials having electrical insulating property, and upon coating on surface of formed plastic films or processed plastic materials by spraying, dipping, roll-coating and other methods and forming solidified films or membranes by thermal polymerization or ultraviolet irradiation for purpose of adding non-inflammable, flame retardant properties and/or ion conductive properties.

EXAMPLES

The following examples are provided to illustrate this invention without limiting the invention thereto. Although the examples are directed to the production of polymer electrolytes for lithium ion batteries and lithium ion capacitors, those skills in the art can easily modify the examples by changing the charge transfer ion source to adapt the electrolytes as described above for use in other electrochemical devices, e.g. PEM fuel cell batteries, a dye sensitized solar cell, organic EL cell.

All parts and percentages therein are indicated "by weight" unless otherwise specified. All chemical compounds synthesized in Examples were identified by means of IR spectrometry and NMR.

Synthesis Example 1 of Molten Salt Monomer

Synthesis of 1-methyl-1-propyl piperidinium bis{(trifluoromethane)sulfonyl}imide (MPP•TFSI)

N-methyl piperidine in 99.2 g was dissolved in acetone of 300 ml, and propylbromide in 120.9 g was instilled slowly in the solution at 50° C. After making reaction for 8 hours, the solution was cooled and then became crystals of 1-methyl-1-propyl piperidine bromide (MPP•Br). The crystals were filtered and washed with acetone, and dried. As the result, MPP•Br in 113 g was obtained. MPP•Br in 110 g was dissolved in ion-exchanged water of 100 ml, on the other hand lithium {bis{(trifluoromethane)sulfonyl}imide (Li•TFSI) in 158 g was dissolved in ion-exchanged water of 100 ml. Besides the solution of Li•TFSI was instilled into the solution of MPP•Br and reacted. MPP•TFSI was made separation from the solution, washed with ion-exchanged water of 100 ml and then refined through repeating separations. By dehydrating at 30° C. under vacuum, MPP•TFSI in 169 g was obtained.

Synthesis Example 2 of Molten Salt Monomer

Synthesis of diallyldimethylammonium bis{(trifluoromethane)sulfonyl}imide (DAA•TFSI)

Diallyl dimethylammonium chloride (Trade mark DADMAC in 60% solution produced by DAISO Co.) in 161.5 g was added in stirring to the solution in which Li•TFSI in 316 g was dissolved in ion-exchanged water of 300 ml, and reacted. Diallyldimethyl ammonium bis{(trifluoromethane)sulfonyl}imide (DAA•TFSI) was made separation from the solution, washed with ion-exchanged water of 200 ml and then refined through repeating separations. By dehydrating at 30° C. under vacuum, DAA•TFSI in 365.4 g was obtained.

Synthesis Example 3 of Molten Salt Monomer

Synthesis of trimethyl aminoethylmethacrylate bis{(trifluoromethane)sulfonyl}imide (TMAEMA•TFSI)

Quaternary salt of dimethyl aminoethylmethacrylate methyl chloride (QDM) in 187.5 g was dissolved in ion-exchanged water of 300 ml, and H•TFSI in 70% aqueous solution of 367.5 g was slowly instilled in stirring into the solution and reacted. Thus obtained trimethyl aminoethylmethacrylate bis{(trifluoromethane)sulfonyl}imide (TMAEMA•TFSI) was made separation from the solution, washed with ion-exchanged water of 200 ml and then refined through repeating separations. By dehydrating at 30° C. under vacuum, TMAEMA•TFSI in 376.5 g was obtained.

In case Li salt of TFSI was used instead of H•TFSI, TMAEMA•TFSI was also obtained.

Synthesis Example 4 of Molten Salt Monomer

Reaction of Quaternary Salt of Dimethyl Aminopropylacrylamide Methylchloride with TFSI (TMAPAA•TFSI)

75% aqueous solution in 106.7 g of quaternary salt of dimethyl aminopropyl acrylamide methyl chloride (DMA- PAA-Q) was diluted in ion-exchanged water of 50 ml and 70% aqueous solution in 156 g of H•TFSI was slowly instilled in stirring into the solution and reacted, Thus obtained trimethyl aminopropyl acrylamide{(trifluoromethane) sulfonyl}imide (TMAPAA•TFSI) was made separation from the solution, washed with ion-exchanged water of 100 ml and then refined through repeating separations. By dehydrating at 30° C. under vacuum, TMAPAA•TFSI in 79 g was obtained.

In case Li salt of TFSI was used instead of H•TFSI, TMAPAA•TFSI was also obtained.

Synthesis Example 5 of Molten Salt Monomer

Reaction of Quaternary Salt of Dimethyl Aminoethylmethacrylate Methyl Chloride with TFSI (TMAEA•TFSI)

Quaternary salt of dimethyl aminoethylmethacrylate methyl chloride (DMAEA-Q produced by Kojin Co.) in 50 g was dissolved in ion-exchanged water of 50 ml, and 70% aqueous solution in 104 g of H•TFSI was slowly instilled in stirring into the solution and reacted, Thus obtained trimethyl aminoethylacyrylate bis (trifluoromethane)sulfonylimide (TMAEA•TFSI) was made separation from the solution, washed with ion-exchanged water of 60 ml and then refined through repeating separations. By dehydrating at 30° C. under vacuum, TMAEA•TFSI in 90 g was obtained.

In case Li salt of TFSI was used instead of H•TFSI, TMAEA•TFSI was also obtained.

Synthesis Example 6 of Molten Salt Monomer

Reaction of Quaternary Salt of Dimethyl Aminoethylmethacrylate Methyl Chloride with Tetrafluoroborate ($BF_4$) (TMAEMA•$BF_4$)

Quaternary salt of dimethyl aminoethylmethacrylate methyl chloride (QDM) in 175.5 g was dissolved in ion-exchanged water of 300 ml, and 70% aqueous solution in 124.4 g prepared by dissolving Li$BF_4$ powder in water was slowly instilled in stirring into the solution and reacted. Thus obtained trimethyl aminoethylmethacrylate tetrafluoroborate (TMAEA•$BF_4$) was made separation from the solution, washed with ion-exchanged water of 200 ml and then refined through repeating separations. By dehydrating at 30° C. under vacuum, TMAEMA•$BF_4$ in 174.0 g was obtained.

In case of DMAPAA-Q in Synthesis Example 4, and DMAEA-Q in Synthesis Example 5 was used instead of QDM, TMAPAA•$BF_4$ and TMAEA•$BF_4$ were also obtained by reacting with tetrafluoroborate ($BF_4$) respectively.

Synthesis Example 7 of Molten Salt Monomer

Reaction of Quaternary Salt of Dimethyl Aminoethylmethacrylate Methyl Chloride with Hexafluorophosphoric Acid ($PF_6$) (TMAEMA•$PF_6$)

Quaternary salt of dimethyl aminoethylmethacrylate methyl chloride (QDM) in 182.3 g was dissolved in ion-exchanged water of 300 ml, and 70% aqueous solution in 146.8 g prepared by dissolving Li$PF_6$ powder in water was slowly instilled in stirring into the solution and reacted. Thus obtained trimethyl aminoethylmethacrylate methyl hexafluorophosphate (TMAEMA•$PF_6$) was made separation from the solution, washed with ion-exchanged water of 200 ml and then refined through repeating separations. By dehydrating at 30° C. under vacuum, TMAEMA•$PF_6$ (214.0 g) was obtained.

In case of DMAPAA-Q in Synthesis Example 4, and DMAEA-Q in Synthesis Example 5 was used instead of QDM, TMAPAA•$PF_6$ and TMAEA•$PF_6$ were also obtained by reacting with hexafluorophosphoric acid ($PF_6$) respectively.

Synthesis Example 8 of Molten Salt Monomer

Reaction of quaternary salt of dimethyl aminoethylmethacrylate methyl chloride with bis(fluorosulfonyl)imide (FSI) (TMAEMA•FSI)

Quaternary salt of dimethyl aminoethylmethacrylate methyl chloride (QDM) in 183.6 g was dissolved in ion-exchanged water of 300 ml, and 70% aqueous solution in 304.5 g prepared by dissolving KFSI powder in water was slowly instilled in stirring into the solution and reacted. Thus obtained trimethyl aminoethylmethacrylate bis (fluorosulfonyl)imide (TMAEMA•FSI) was made separation from the solution, washed with ion-exchanged water of 200 ml and then refined through repeating separations. By dehydrating at 30° C. under vacuum, TMAEMA•FSI in 249.1 g was obtained.

In case of DMAPAA-Q in Synthesis Example 4, and DMAEA-Q in Synthesis Example 5 was used instead of QDM, TMAPAA•FSI and TMAEA•FSI were also obtained by reacting with bis(fluorosulfonyl)imide acid (FSI) respectively.

Synthesis Example 9 of Molten Salt Monomer

In Synthesis Example 8, in case of MPP•Br in Synthesis Example 1, and DADMAC in Synthesis Example 2 was used instead of QDM, MPP•FSI and DAA•FSI were also obtained by reacting with bis(fluorosulfonyl)imide acid (FSI) respectively.

Examples 1 to 4

—($CH_2$—$CF_2$)m-($CF_2$—CFCl)n-{m=96 mol %, n=4 mol %; Product No. #7500 produced by Kureha Chemical Co.; intrinsic viscosity [η]=2.55 (value measured by means of Ostwald viscometer, using DMAC solvent at 25° C.); molecular weight supposed from [η]=2.55 is 1.2 million} was used as a copolymer of vinylidene fluoride (PVdF)-trifluoro chloro ethylene (CTFE).

A molten salt monomer was graft-polymerized with this copolymer under the following conditions.

PVdF-CTFE copolymer #7500 in 6 g and N-methyl pyrolidone (NMP) in 80 g was added to a three necks flask of 1 L size, and heated in oil bath at 80° C. and dissolved in stirring. After replacing the atmosphere with argon gas sufficiently, molten salt monomers trimethyl aminoethylmethacrylate bis{(trifluoromethane)sulfonyl}imide (TMAEMA•TFSI) as Synthesis Example 3 having 4 different amounts as shown in Table 1, and bpy in 0.46 g and CuCl in 0.08 g dissolved in NMP of 20 g were added to the solution. Further by replacing the atomosphere with argon, the mixed solution was reacted at 90° C. for 23 hours.

After the reaction, the solution was cooled down to 40° C., and diluted with acetone. This diluted solution was added to 50% aqueous solution of methanol in stirring and precipitated. Thus the obtained product was washed with methanol solution and dried, and the crude polymer was obtained.

The crude polymer was crashed and added to mixed solvent of acetone in 40% and methanol in 60% and made stirred. Non-grafting polymerized polymer of molten salt monomer and non-reacted molten salt monomer were dissolved in the mixed solvent, and grafted polymer was swollen and precipitated, and separated with centrifuge. By repeating this operation, grafted polymer without homo polymer was obtained. Further the grafted polymer was dried in vacuum at 30° C., and then the yield of grafted polymer was measured and the grafted ratio in mol % was measured by infrared spectrum.

The result are shown in Table 1.

TABLE 1

| Example | TMAEMA•TFSI Mol | TMAEMA•TFSI g | Grafted Ratio mol % | Yield g |
|---|---|---|---|---|
| 1 | 0.53 | 21.7 | 7.7 | 8.0 |
| 2 | 0.70 | 28.7 | 13.6 | 9.5 |
| 3 | 1.00 | 41.0 | 20.4 | 16.8 |
| 4 | 1.70 | 69.8 | 29.7 | 26.8 |

Figure 3:
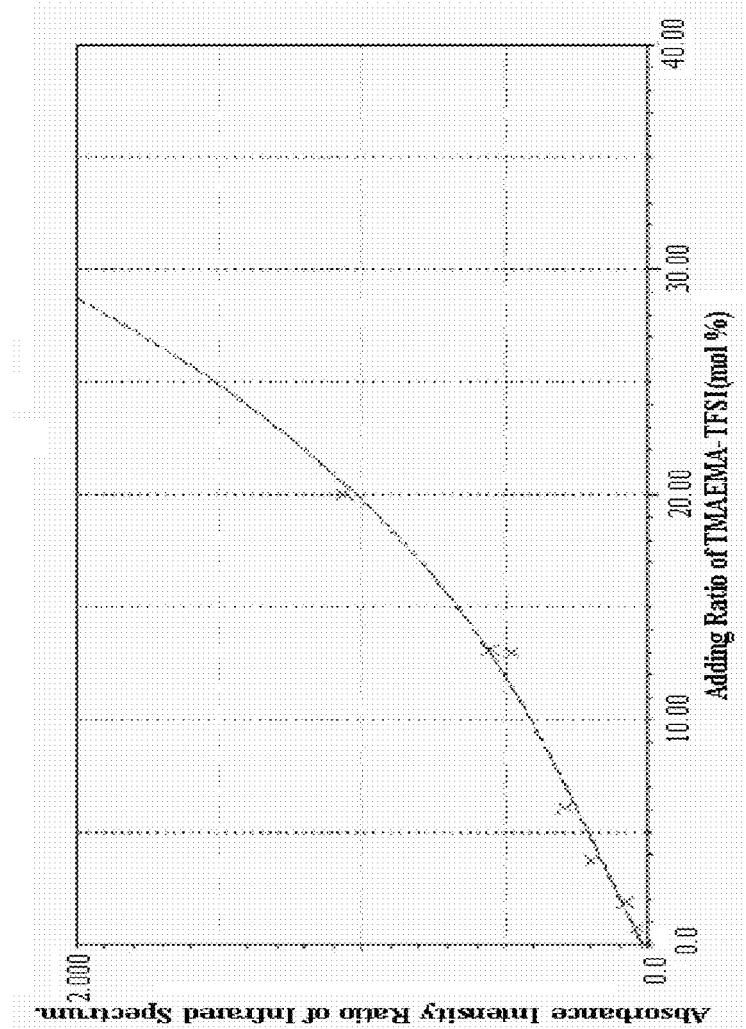
FIG. 3 Calibration curve by measuring an infrared spectrum of several formulating ratio between polyvinylidene fluoride co-polymer (#7500) and TMAEMA-TFSI as ionic liquid.

Remark 1)
Mol of TMAEMA•TFSI in Case of Example 2
The use amount of TMAEMA•TFSI in 1 mol: 452.2/66.1 × 6 = 41.0 g
In case of TMAEMA•TFSI in 0.7 mol: 41 × 0.7 = 28.7 g
Remark 2)
Grafted Ratio in mol %
Changing the ratio in mol % of PVdF-CTFE copolymer and TMAEMA•TFSI, calibration curve in FIG. 3 was prepared by measuring infrared spectrum.
Lateral axis shows the adding ratio in mol % of TMAEMA•TFSI, and longitudinal axis shows absorbance intensity ratio of infrared spectrum.
The grafted ratio in mol % of TMAEMA•TFSI with the used test pieces was measured by using this calibration curve.
PVdF-CTFE 881 cm$^{-1}$, TMAEMA•TFSI 1729 cm$^{-1}$ Use of "C = 0".

Figure 2:
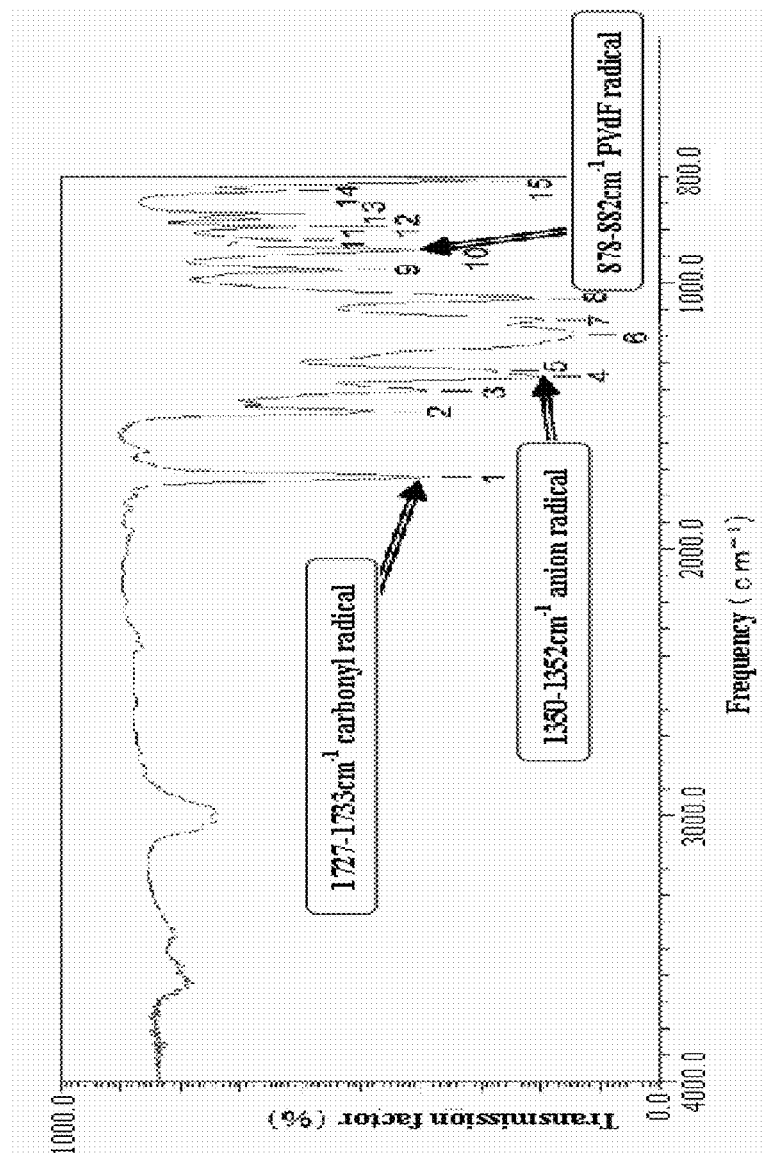
FIG. 2 IR chart of a polymer grafting with TMAEMA-TFSI in Example 3 herein.

The comparison of IR Chart between PVdF-CTFE copolymer as #7500 and TMAEMA•TFSI grafted polymer in Example 3 was shown in FIGS. 1 and 2.
The frequency (cm$^{-1}$) corresponding to each peak No. in FIG. 1 and the transmission factor (%) was shown in Table 2.

TABLE 2

| Peak No. | Frequency (cm$^{-1}$) | Transmission factor (%) |
|---|---|---|
| 001 | 3021.91 | 78.9557 |
| 002 | 2979.48 | 79.7787 |
| 003 | 1428.99 | 70.7408 |
| 004 | 1403.92 | 43.3171 |
| 005 | 1234.22 | 47.0943 |
| 006 | 1176.36 | 38.4533 |
| 007 | 1072.23 | 65.6967 |
| 008 | 881.309 | 44.8682 |
| 009 | 838.883 | 66.0592 |
| 010 | 748.245 | 88.0948 |

The frequency (cm$^{-1}$) and the transmission factor (%) corresponding to each peak No. in FIG. 2 were shown in Table 3.

TABLE 3

| Peak No. | Frequency (cm$^{-1}$) | Transmission factor (%) |
|---|---|---|
| 001 | 1731.76 | 38.8005 |
| 002 | 1479.13 | 47.1221 |
| 003 | 1403.92 | 38.8289 |
| 004 | 1351.86 | 20.2851 |
| 005 | 1330.64 | 27.6104 |
| 006 | 1191.79 | 14.4617 |
| 007 | 1139.72 | 19.6310 |
| 008 | 1056.80 | 20.7483 |

TABLE 3-continued

| Peak No. | Frequency (cm$^{-1}$) | Transmission factor (%) |
|---|---|---|
| 009 | 952.663 | 52.9020 |
| 010 | 879.381 | 40.8459 |
| 011 | 840.812 | 61.7125 |
| 012 | 790.671 | 60.8308 |
| 013 | 740.531. | 58.6470 |
| 014 | 653.750 | 62.6113 |
| 015 | 617.109 | 30.6178 |

TMAEMA•TFSI grafted PVdF in Example 3 has a strong absorption peak of carbonyl at 1727-1733 cm$^{-1}$, and it means TMAEMA•TFSI is grafted.
1350-1352 cm$^{-1}$ shows a absorption peak of anion.
The absorption peak of PVdF-CTFE (#7500) copolymer is around at 878-882 cm$^{-1}$.

The absorption peak of TMAEMA•TFSI grafted PVdF in Example 3 is reduced.

As the result, it is confirmed that two IR Charts in FIGS. 1 and 2 of PVdF-CTFE copolymer as #7500 and TMAEMA•TFSI grafted PVdF in Example 3 has a absorption peak as mentioned above, and that from the comparison of two Charts TMAEMA•TFSI is grafted.

Example 5

Except that —(CH$_2$—CF$_2$)m-(CF$_2$—CFCl)n- having 7 mol % of CTFE {m=93 mol %, n=7 mol %; Product No. FD3145 produced by Kureha Chemical Co.; intrinsic viscosity [η]=2.42 value measured by means of Ostwald viscometer, using dimethylacetamide (DMAC) solvent at 25° C.; molecular weight supposed from the above [η] is 1.11 million} was used in stead of the copolymer having 4 mol % of CTFE in Example 3 and that CuBr was used in stead of CuCl as a catalyst of grafting polymerization, grafting polymerization was carried out in the same manner as Example 3. The result is shown in Table 4.

TABLE 4

| Example | TMAEMA•TFSI Mol | TMAEMA•TFSI g | Grafted Ratio mol % | Yield g |
|---|---|---|---|---|
| 5 | 1.0 | 40.1 | 17.1 | 13.2 |

Remark 1)
The mol amount of TMAEMA•TFSI: The mean molecular weight of the monomer used for -(PVdF)m-(CTFE)n-(m = 93 mol %, n = 7 mol %) is 67.7.

Example 6

Except that trimethyl aminoethylmethacrylate hexafluoro phosphate (TMAEMA•PF$_6$) in Synthesis Example 7, 43.0 g was used instead of TMAEMA•TFSI in Example 3. Grafting polymerization was carried out in the same manner as Example 3. The result is shown in Table 5.

TABLE 5

| Example | TMAEMA•PF$_6$ Mol | TMAEMA•PF$_6$ g | Grafted Ratio mol % | Yield g |
|---|---|---|---|---|
| 6 | 1.5 | 43.0 | 27.1 | 13.6 |

Remark 1)
Molecular weight of TMAEMA•PF$_6$ is 316.2.

Example 7

Except that trimethyl aminopropylacrylamide{(trifluoromethane)sulfonyl}imide (TMAPAA•TFSI) in Synthesis Example 4, 61.5 g was used in stead of TMAEMA•TFSI in Example 3, grafting polymerization was carried out in the same manner as Example 3. The result is shown in Table 6.

TABLE 6

| Example | TMAPPA•TFSI Mol | TMAPPA•TFSI g | Grafted Ratio mol % | Yield g |
|---|---|---|---|---|
| 7 | 1.5 | 61.5 | 3.5 | 6.0 |

Note 1)
Molecular weight of TMAPPA•TFSI is 451.4.

Example 8

Except that trimethyl aminoethylacyrylate bis{(trifluoromethane)sulfonyl}imide (TMAEA•TFSI) in Synthesis Example 5, 39.8 g was used in stead of TMAEMA•TFSI in Example 3, grafting polymerization was carried out in the same manner as Example 3. The result is shown in Table 7.

TABLE 7

| Example | TMAEA•TFSI Mol | TMAEA•TFSI g | Grafted Ratio mol % | Yield g |
|---|---|---|---|---|
| 8 | 1.0 | 39.8 | 18.5 | 14.0 |

Note 1)
Molecular weight of TMAEA•TFSI is 438.2.

Example 9

Except that trimethyl aminoethylmethacrylate bis(fluorosulfonyl)imide (TMAEMA•FSI) in Synthesis Example 8, 34.7 g was used in stead of TMAEMA•TFSI in Example 3, grafting polymerization was carried out in the same manner as Example 3. The result is shown in Table 8.

TABLE 8

| Example | TMAEMA•FSI Mol | TMAEMA•FSI g | Grafted Ratio mol % | Yield g |
|---|---|---|---|---|
| 9 | 1.0 | 34.7 | 14.4 | 11.2 |

Note 1)
Molecular weight of TMAEMA•FSI is 352.3

Comparative Examples

Comparative Examples 1 to 3

Except that vinylidene fluoride polymer having —(CH$_2$—CF$_2$)— unit {Trade No. #1700 produced by Kureha Chemical Co.} as Comparative Example 1, vinylidene fluoride polymer having —(CH$_2$—CF$_2$)— unit (Trade Mark Kynar 461 produced by Solvay Co.) as Comparative Example 2 and copolymer of vinylidene fluoride (PVdF) and hexafluoro propylene (HFP) (Trade Mark Kynar 2801 produced by Solvay Co.) as Comparative Example 3 which are not containing chloride were used in stead of PVdF-CTFE copolymer as #7500 in Example 3 respectively, grafting polymerization was carried out in the same manner as Example 3.

TABLE 9

| Comparative Example | Trunk Polymer | TMAEMA•TFSI Mol | TMAEMA•TFSI g | Grafted Ratio mol % | Yield g |
|---|---|---|---|---|---|
| 1 | #1700 | 1.0 | 42.4 | 2.1 | 5.5 |
| 2 | Kynar 461 | 1.0 | 42.4 | 1.8 | 5.2 |
| 3 | Kynar 2801 | 1.0 | 38.3 | 2.0 | 5.4 |

It is understood that the grafting ratio is reduced by using trunk polymers containing no chloride.

TABLE 10

| Comparative Example | Trunk polymer | Polymer | HEP mol % | Intrinsic viscosity [η] | MW: Average molecular weight (ten thousand) |
|---|---|---|---|---|---|
| 1 | #1700 | PVdF | 0 | 1.99 | 79.4 |
| 2 | Kynar 461 | PVdF | 0 | 1.04 | 31.8 |
| 3 | Kynar 2801 | PVdF-HEP | 8.0 | 1.20 | 39.3 |

Calculation of molecular weight (MW) using Intrinsic viscosity $[\eta] = 2.01 \times 10^{-4} \times MW^{0.675}$ From this formula, $Mw = (\eta/2.01 \times 10^{-4})^{1/0.675}$
Source: Solubility Parameter of Polyvinylidene fluoride, Journal of Polymer Science Part B Polymer Physics Vol. 26, 785-794

Example 10

Preparation of Precursor Solution of New Composite Electrolyte

As shown in Synthesis Example 1, 1-methyl-1-propyl piperidinium bis{(trifluoromethane)sulfonyl}imide (MPP•TFSI) was synthesized.

As shown in Synthesis Example 2, diallyldimethyl ammonium bis{(trifluoromethane)sulfonyl}imide (DAA•TFSI) was synthesized.

As shown in Example 3, polymer containing fluorine grafted with trimethyl amino ethyl methacrylate (TMAEMA-grafted polymer) was synthesized.

The solution of Li•TFSI in 1.3 mol being doped to MPP•TFSI in 2.4 g was dissolved in the precursor solution of TMAEMA-graft polymer in 5.0 g being dissolved in NMP of 295 g, and stirred with homogenizer and then the non-inflammable precursor solution which was uniformly dispersed solution was obtained. Thereafter DAA•TFSI in 1.6 g as the molten salt monomer having reactive group was added to the solution and stirred with homogenizer to obtain the non-inflammable precursor solution.

Preparation of Cathode Electrode

Cathode solution comprising 90% by weight of LiCoO$_2$ which is a cathodic active material, 5% by weight of acetylene black which is electrical conductive material and 5% by weight of the above electrolyte precursor solution was prepared, and then this solution was added to NMP solvent to obtain cathode paint in which the solid content was 50% by weight. Thus obtained cathode paint was coated on aluminum collector foil, and then the coated layer was heat-treated by increasing the temperature from 70° C. to 100° C. and further by increasing up to 130° C. for 45 minutes of the total heat-time, and then compressed to a thickness of one side cathode layer in 15 μm.

Preparation of Anode Electrode

Anode solution comprising 95% by weight of natural graphite which is a anodic active material, 2% by weight of carbon black (Trade name: Ketjenblack produced by Lion Corp.) which is electrical conductive material and 3% by weight of the above electrolyte precursor solution was prepared, and then this solution was added to NMP solvent to obtain anode paint in which the solid content was 50% by weight. Thus obtained anode paint was coated on cupper collector foil, and then the coated layer was heat-treated by increasing the temperature from 80° C. to 110° C. and further by increasing up to 130° C. for 45 minutes of the total heat-time, and then compressed to a thickness of one side anode layer in 20 μm.

Electrolyte Membrane Between Electrodes

The non-inflammable precursor solution was casted on a 100 μm of polyester film (T-type produced by Toray Co.), heated at 130° C. for 30 minutes to form a composite polymer electrolyte film having a thickness of 20 μm.

The electrolyte film thus prepared was overlaid on the cathode as prepared above, and integrated through a nip between a pair of rolls heated at 130° C. After stripping off the polyester film, a integrated sheet having a layer of cathode and a layer of electrolyte was prepared. The electrolyte layer of this integrated sheet was overlaid on the anode as prepared above.

This integrated sheet comprising a layer of cathode, electrolyte membrane and a layer of anode was heated through a nip between a pair of rolls at 130° C. and then compressed at 150° C. under 10 kg/cm$^2$ press for 30 minutes to form a gel. The grafted polymer in the electrolyte film was existed in a lamella structure.

The resulting integrated sheet was punched into a disc of 15 mm diameter, and put in stainless steel (SUS) container. A coin shaped cell was prepared by installing a spring and caps which were made of the same materials for the coin and pressed to form coin shaped cell.

The finished coin cell was tested for charge-discharge cycling performance at 20° C. The test conditions: The cell was charged at a constant current of 1 mA until a voltage of 4.0 was reached, and discharged at a constant current of 1 mA until a voltage of 2.5 V.

The performance was evaluated in terms of % retention of the normal discharge capacity as designed. The discharge capacity was 96% as IR drop result at the initial cycle and then cycling at 100% as the capacity after deducting IR drop 99% was at the 20th cycle.

Examples 11 to 18

Except that grafted polymers produced by Examples 1 to 9 except Example 3 were used instead of grafted polymer of Example 3 in Example 10, composite electrolyte membrane and cell was obtained in the same manner as in Example 10.

The properties of the cells such as electrical conductive property of membrane, ion conductivity, non-inflammability, mechanical strength, tensile strength, etc. are shown in Table 11.

Comparative Examples 4 to 6

Except that grafted polymers produced by Comparative Examples 1 to 3 were used instead of graft-polymer of Example 3 in Example 10, composite electrolyte membrane and cell was obtained in the same manner as in Example 10.

The results are shown in Table 11.

TABLE 11

| Example | Electrical conductive property of membrane at 20° C. | Ion Conductivity as Ion Transfer Coefficient | Tensile strength (M · Pas) | Property of cell (Remark 1) | |
|---|---|---|---|---|---|
| | | | | At the Initial cycle | After 20th cycle |
| Example 10 | $1.4 \times 10^{-3}$/cm | 0.49 | 13 | 96% | 99% |
| Example 11 | $1.0 \times 10^{-3}$/cm | 0.53 | 15 | 96% | 98% |
| Example 12 | $0.4 \times 10^{-3}$/cm | 0.66 | 18 | 98% | 99% |
| Example 13 | $1.7 \times 10^{-3}$/cm | 0.64 | Just Stretching | 98% | 99% |
| Example 14 | $0.7 \times 10^{-3}$/cm | 0.58 | 17 | 98% | 98% |
| Example 15 | $1.5 \times 10^{-3}$/cm | 0.65 | Just Stretching | 98% | 99% |
| Example 16 | $1.6 \times 10^{-3}$/cm | 0.43 | 8 | 96% | 98% |
| Example 17 | $0.5 \times 10^{-3}$/cm | 0.63 | 17 | 98% | 99% |
| Example 18 | $1.8 \times 10^{-3}$/cm | 0.65 | 17 | 98% | 99% |
| Comparative Example 4 | $6.5 \times 10^{-4}$/cm | 0.38 | 12 | 93% | 79% |
| Comparative Example 5 | $3.0 \times 10^{-4}$/cm | 0.41 | 6 | 94% | 83% |
| Comparative Example 6 | $1.6 \times 10^{-4}$/cm | 0.46 | 5 | 95% | 85% |

Example 10 (Use of grafted polymer of Example 3)
Example 11 (Use of grafted polymer of Example 1)
Example 12 (Use of grafted polymer of Example 2)
Example 13 (Use of grafted polymer of Example 4)
Example 14 (Use of grafted polymer of Example 5)
Example 15 (Use of grafted polymer of Example 6)
Example 16 (Use of grafted polymer of Example 7)
Example 17 (Use of grafted polymer of Example 8)
Example 18 (Use of grafted polymer of Example 9)
Comparative Example 4 (Use of grafted polymer of Comparative Example 1)
Comparative Example 5 (Use of grafted polymer of Comparative Example 2)
Comparative Example 6 (Use of grafted polymer of Comparative Example 3)
Remark 1 These capacity % means Remaining % deducting Resistance drop rate at the initial Cycle as IR Drop. These cycle properties % means Remaining capacity % deducting Capacity drop % after 20 cycles of charge-discharge starting the capacity after IR Drop deducted at 100%.
Remark 2 Transport number: Transport number of liquid junction potential is calculated according to a method of battery-electric potential.
Remark 3 Electrical conductive property: Test pieces are put between platinum electrodes (electrode area: 0.95 cm$^2$), and the resistance of membrane is measured according to a method of alternating current impedance in 0.1 V, Frequency in 1 Hz to 10 MHz at 20° C. and 65% RH, and on the basis of this resistance of membrane, the electrical conductive property is calculated.
Remark 4 Tensile strength: measured by using Tensile strength test machine (Trade Mark: [Tensiron RT 1350] produced by A & D Co.) at 23° C. and 5 cm/min.

In Examples and Comparative Examples, safety test using aluminum laminate cell was carried out. In detail, by using safety test machine capable of overcharge and discharge test, pressure breakage test, nail or needle penetration test were carried out under the following conditions;

Test machine: Battery safety test machine (produced by Miwa Seisakusyo Co.) is used for nail or needle penetration test and heat-pressure breakage test.
Detail of needle: use of needle for cotton yarn in 0.8 mm diameter
Speed of penetration: 1 mm/sec.
As the test result, it is confirmed that all cells of Examples and Comparative Examples were neither ignited nor smoked, and non-inflammable.

INDUSTRIAL APPLICABILITY OF THIS INVENTION

According to this invention, a process for producing fluorine containing polymer to obtain composite polymer electrolyte composition having excellent ion transfer coefficient, that is, ion transport number of lithium ion, is provided. In case of using this fluorine polymer as the composite polymer electrolyte composition in this inventive method, ion transport number is extremely high, and in case of using this electrolyte composition as the electrolyte composition for lithium battery, lithium battery having high performance is provided. Further the electrolyte composition containing this fluorine polymer of this invention is non-inflammable and so capability of ignition is extremely less. Further the polymer electrolyte film of this composition is excellent in plastic property and mechanical strength such as tensile and elongation strengths. As mentioned above, this invention has a high industrial applicability.

The invention claimed is:

1. A process for producing fluorine containing polymer comprising graft-polymerizing a molten salt monomer having a polymerizable functional group and a quaternary ammonium salt structure having a quaternary ammonium cation and a fluorine-containing anion, with a copolymer having a following unit;

$$-(CR^3R^4-CR^5F)_m-(CR^1R^2-CFX)_n-$$

X means halogen atom except fluorine atom,
$R^1$, $R^2$, $R^3$, $R^4$ and $R^5$ means hydrogen atom or fluorine atom, each is same or different,
m is of 99 to 65 mol %,
n is of 1 to 35 mol %.

2. A process for producing fluorine containing polymer according to claim 1, wherein the copolymer having a unit of $-(CR^3R^4-CR^5F)_m-(CR^1R^2-CFX)_n-$ is a copolymer having a following unit;

$$-(CH_2-CF_2)_m-(CF_2-CFCl)_n-$$

m is of 99 to 65 mol %,
n is of 1 to 35 mol %.

3. A process for producing fluorine containing polymer according to claim 1, wherein a molten salt monomer is graft-polymerized by pulling out halogen other than fluorine of the copolymer having a unit of $-(CR^3R^4-CR^5F)_m-(CR^1R^2-CFX)_n-$ under an atom transfer radical polymerization.

4. A process for producing fluorine containing polymer according to claim 1, wherein a molten salt monomer is graft-polymerized with a copolymer having a unit of $$-(CR^3R^4-CR^5F)_m$$

$-(CR^1R^2-CFX)_n-$ in the grafting ratio of 3 to 40 mol %.

5. A process for producing fluorine containing polymer according to claim 1,
wherein the molten salt monomer is a salt having at least one ammonium quaternary cation selected from the group consisting of
(A) trialkylaminoethylmethacrylate ammonium cation,
trialkylaminoethylacrylate ammonium cation,
trialkylaminopropylacrylamido ammonium cation,
1-alkyl-3-vinylimidazolium cation,
4-vinyl-1-alkylpyridinium cation,
1-(4-vinylbenzyl)-3-alkyl imidazolium cation,
1-(vinyloxyethyl)-3-alkylimidazolium cation,
1-vinyl imidazolium cation, 1-allylimidazolium cation,
N-alkyl-N-allylammonium cation,
1-vinyl-3-alkylimidazolium cation,
1-glycidyl-3-alkyl-imidazolium cation,
N-allyl-N-alkylpyrrolidinium cation and quaternary diallyl dialkyl ammonium cation and at least one anion selected from the group consisting of
(B) bis {(trifluoromethane)sulfonylimide}anion,
2,2,2-trifluoro-N-{(trifluoromethane) sulfonyl}acetimide anion,
bis{(pentafluoro)sulfonyl}imide anion,
bis(fluorosulfonyl}imide anion, tetra fluoroborate anion, hexafluorophosphate anion, and
trifluoromethanesulfonylimide anion.

6. Fluorine containing polymer comprising graft-polymer of a molten salt monomer having a polymerizable functional group and a quaternary ammonium salt structure having a quaternary ammonium cation and a fluorine containing anion, with a copolymer having a following unit;

$$-(CR^3R^4-CR^5F)_m-(CR^1R^2-CFX)_n$$

X means halogen atom except fluorine atom,
$R^1$, $R^2$, $R^3$, $R^4$ and $R^5$ means hydrogen atom or fluorine atom, each is same or different,
M is of 99 to 65 mol %,
N is of 1 to 35 mol %.

* * * * *